(12) United States Patent
Hendrix et al.

(10) Patent No.: US 11,821,087 B2
(45) Date of Patent: Nov. 21, 2023

(54) VAPORIZATION VESSEL AND METHOD

(71) Applicant: ENTEGRIS, INC., Billerica, MA (US)

(72) Inventors: Bryan C. Hendrix, Danbury, CT (US); Scott L Battle, Cedar Park, TX (US); David J. Eldridge, Liberty Hill, TX (US); John N. Gregg, Marble Falls, TX (US); Jacob Thomas, Leander, TX (US); Manuel F. Gonzales, Fort Worth, TX (US); Kenney R. Jordan, Denton, TX (US); Benjamin H. Olson, Round Rock, TX (US)

(73) Assignee: ENTEGRIS, INC., Billerica, MA (US)

( * ) Notice: Subject to any disclaimer, the term of this patent is extended or adjusted under 35 U.S.C. 154(b) by 175 days.

(21) Appl. No.: 16/856,687

(22) Filed: Apr. 23, 2020

(65) Prior Publication Data

US 2020/0340110 A1    Oct. 29, 2020

Related U.S. Application Data

(60) Provisional application No. 62/839,181, filed on Apr. 26, 2019.

(51) Int. Cl.
*C23C 16/458* (2006.01)
*C23C 14/18* (2006.01)
*H01L 21/02* (2006.01)

(52) U.S. Cl.
CPC ........ *C23C 16/4583* (2013.01); *C23C 14/185* (2013.01); *H01L 21/02271* (2013.01)

(58) Field of Classification Search
CPC ............ C23C 16/4483; C23C 16/4481; C23C 16/4402
See application file for complete search history.

(56) References Cited

U.S. PATENT DOCUMENTS

| | | | |
|---|---|---|---|
| 6,909,839 B2 | 6/2005 | Wang | |
| 6,921,062 B2 | 7/2005 | Gregg | |
| 8,821,640 B2 | 9/2014 | Cleary | |
| 9,347,616 B2 | 5/2016 | Chism | |
| 10,392,700 B2 | 8/2019 | Baum | |
| 10,551,004 B2 | 2/2020 | Chism | |
| 2001/0003603 A1* | 6/2001 | Eguchi | ............... C23C 16/4481 427/248.1 |
| 2005/0006799 A1 | 1/2005 | Gregg | |
| 2006/0185598 A1 | 8/2006 | Suzuki | |
| 2008/0041310 A1 | 2/2008 | Gregg | |
| 2015/0191819 A1* | 7/2015 | Hendrix | ............. C23C 16/4402 118/728 |
| 2016/0369402 A1* | 12/2016 | Baum | ..................... C23C 16/50 |

(Continued)

FOREIGN PATENT DOCUMENTS

CN    101384749 A    3/2009
CN    101905126 A    12/2010
(Continued)

*Primary Examiner* — Joseph A Miller, Jr.

(57) ABSTRACT

A tray for a vaporization vessel that includes a tray having a side wall, a bottom plate, one or more apertures that extend through the bottom plate, and a duct that extends through and from the bottom plate. The tray configured to support a solid reagent to be vaporized. A method of assembling the tray that includes forming a first tray that has the side wall and the bottom plate. A vaporization vessel that includes one or more of the trays.

10 Claims, 12 Drawing Sheets

(56) References Cited

U.S. PATENT DOCUMENTS

| | | |
|---|---|---|
| 2019/0032206 A1 | 1/2019 | Hodges |
| 2019/0120433 A1 | 4/2019 | Hendrix |
| 2019/0177840 A1 | 6/2019 | Eldridge |
| 2019/0186003 A1 | 6/2019 | Eldridge |

FOREIGN PATENT DOCUMENTS

| | | |
|---|---|---|
| KR | 20120007947 A | 1/2012 |
| KR | 20140002849 A | 1/2014 |
| WO | 2015188950 A1 | 12/2015 |
| WO | 2016131024 A1 | 8/2016 |
| WO | 2019101572 A1 | 5/2019 |

* cited by examiner

VAPORIZATION VESSEL AND METHOD

FIELD

This disclosure generally relates to vessels utilize a flow of carrier gas and solid reagent to provide a stream of vaporized reagent. More specifically, the disclosure relates to structures configured to support the solid reagent to be vaporized.

BACKGROUND

Some manufacturing processes utilize a stream of vaporized material. For example, chemical vapor deposition is a process that utilizes a flow of vaporized material to form a solid layer or film of the material on a surface. In another manufacturing process, a stream of vaporized material is utilized to implant the material into a substrate. This material may be referred to as a reagent. In semiconductor manufacturing, chemical vapor deposition can be used to form precise thin films of the solid reagent on a substrate. A vaporization vessel can be configured to provide a stream of vaporized reagent by vaporizing a solid reagent with a stream of carrier gas. A solid reagent may be in the form of particles, e.g., sintered or non-sintered, granules, or liquids.

SUMMARY

A vaporization vessel includes a housing and one or more trays located within the housing. The trays are configured to support a solid reagent to be vaporized. A carrier gas is provided to the vaporization vessel and flows through the trays and past the solid reagent. The solid reagent is vaporized as the carrier gas flows along the solid reagent. The vaporization vessel generates a stream of reagent gas that includes the vaporized reagent and carrier gas.

Embodiments for a vaporization vessel, a tray for a vaporization vessel, and a method for assembling a tray for a vaporization vessel are disclosed. In some embodiments, a vaporization vessel includes a tray for supporting a solid reagent. In some embodiments, the tray provides the surface for supporting the solid reagent. In an embodiment, the vaporization vessel includes a plurality of the trays.

In an embodiment, a tray includes a bottom plate having a surface configured to support a solid reagent, a side wall, one or more through-holes that extend through the bottom plate, and a duct extending through and from the bottom plate. The duct is configured to fluidly connect to a duct of a second tray stacked on the first tray. In an embodiment, the through-holes extend above the surface of the bottom plate. In an embodiment, the through-holes extend below a lower surface of the bottom plate.

In an embodiment, the tray includes one or more contacting members located along an inner surface of the side wall. Each of the contacting members includes an elastic member which is chemically compatible with the solid reagent that extends upwardly beyond a top edge of the side wall.

In an embodiment, a tray includes one or more arms that extend inwardly from the side wall. The through-holes extend through the one or more arms. In some embodiments, one or more of the arms extend from the side wall to an inner wall of the tray. In an embodiment, the arms are formed separately from the bottom plate and side wall then are secured to within the tray.

In an embodiment, the tray is made of a material comprising aluminum alloy, nickel, graphite or stainless steel.

In an embodiment, the tray is made of a material comprising graphite or treated graphite. In some embodiments, the tray includes one or more contacting members located along an inner surface of the side wall. Each of the contacting members includes an elastic member that extends upwardly beyond a top edge of the side wall.

In an embodiment, a method for assembling a tray includes forming a first tray portion. The first tray portion includes a side wall and a bottom plate. In an embodiment, pre-made arms are secured within the first tray portion. In another embodiment, a plurality of tubes are press-fit through apertures in the bottom plate. The tubes and bottom plate in an embodiment are made of a metal material that allows the tubes to be welded to the bottom plate.

BRIEF DESCRIPTION OF THE DRAWINGS

References are made to the accompanying drawings that form a part of this disclosure, and which illustrate embodiments in which the vaporization vessel and tray(s) for a vaporization vessel described in this specification can be practiced.

Like reference numbers represent like parts throughout.

DETAILED DESCRIPTION

Figure 1A:
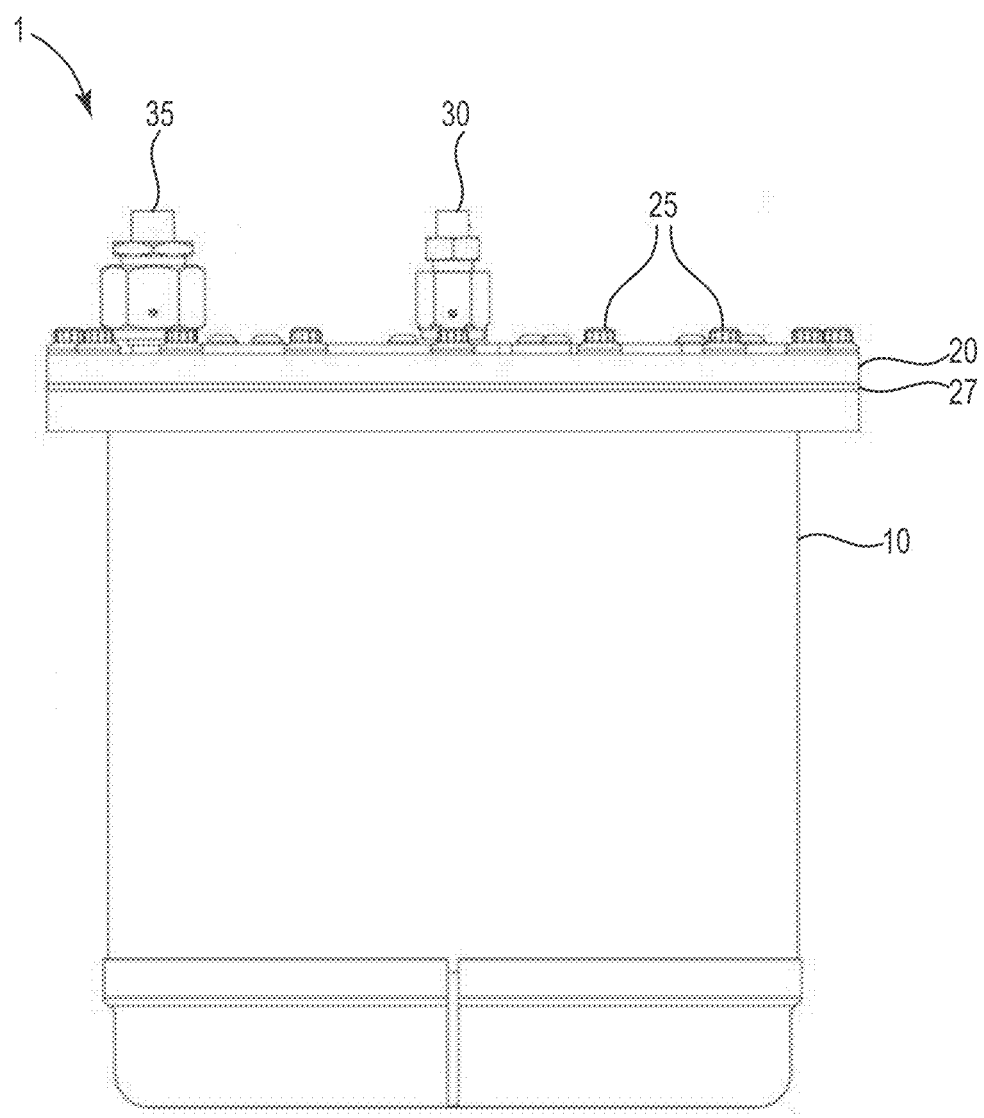
FIGS. 1A and 1B are a side view and a top view of a vaporization vessel, according to an embodiment.

A stream of reagent gas generated from a solid reagent by a vaporization vessel can be utilized to, for example, form a layer of the solid reagent on a substrate, or implant a material into a substrate. The stream of reagent gas includes a vaporized reagent and a carrier gas. The carrier gas is an inert gas that is generally unreactive. For example, an inert gas may include one or more of helium, neon, argon, krypton, xenon, and nitrogen. In particular, a stream of vaporized reagent can be used in forming semiconductors. Many semiconductors are now being manufactured at smaller scales, e.g., a nanometer scale. As the semiconductors are formed at smaller scales, smaller concentrations of metal impurities have been sought to prevent breakdown and operational issues. Accordingly, the vaporized reagents having lower concentrations of metal impurities have been sought in the semiconductor manufacturing industry.

It has been determined that reaction(s) between a tray for a vaporization vessel and the reagent can form metal impurities in amounts that are significant in semiconductor manufacturing. In particular, the amounts of impurities can be significant in semiconductor manufacturing at the nanometer scale. For example, the iron contained in some stainless steel trays has been found to react with some reagents to form metal impurities. For example, metal halides have been found to react with iron to form metal impurities. These chemical reactions may occur between the solid reagent and surface(s) of the tray, and/or between the vaporized reagent and the surfaces of the tray(s).

Embodiments disclosed herein are related to a vaporization vessel, a tray for a vaporization vessel, and methods of assembling and/or forming thereof. A vaporization vessel can be used to provide a stream of vaporized reagent. One or more trays are configured to hold the solid reagent to be vaporized. The vaporization vessel is configured to provide a stream of vaporized reagent by passing a flow of carrier gas along the solid reagent, e.g., to contact the solid reagent, such that a portion of the solid reagent vaporizes and flows with the carrier gas.

The embodiments disclosed herein have a configuration that generates a stream of reagent gas with lower metal impurities. In some embodiments, the tray or tray parts that contact the reagent are made with or coated with a material that generates a significantly lower level of impurities. Some embodiments disclosed herein are configured to provide an improved flow of carrier gas through the tray and as such significantly lower level of impurities.

This disclosure describes several embodiments (but not limited to) of the invention in which the vaporization vessel is configured to provide a stream of reagent gas that contains equal to or less than ten part per million ("ppm") of metal impurities relative to the amount of vaporized reagent, or less than three ppm of metal impurities relative to the amount of vaporized reagent, or one ppm of metal impurities relative to the amount of vaporized reagent. In other embodiments, the vaporization vessel is configured to provide a stream of reagent gas that is less than or equal to a detectable amount of impurities relative to the specific vaporized reagent used.

Figure 1B:
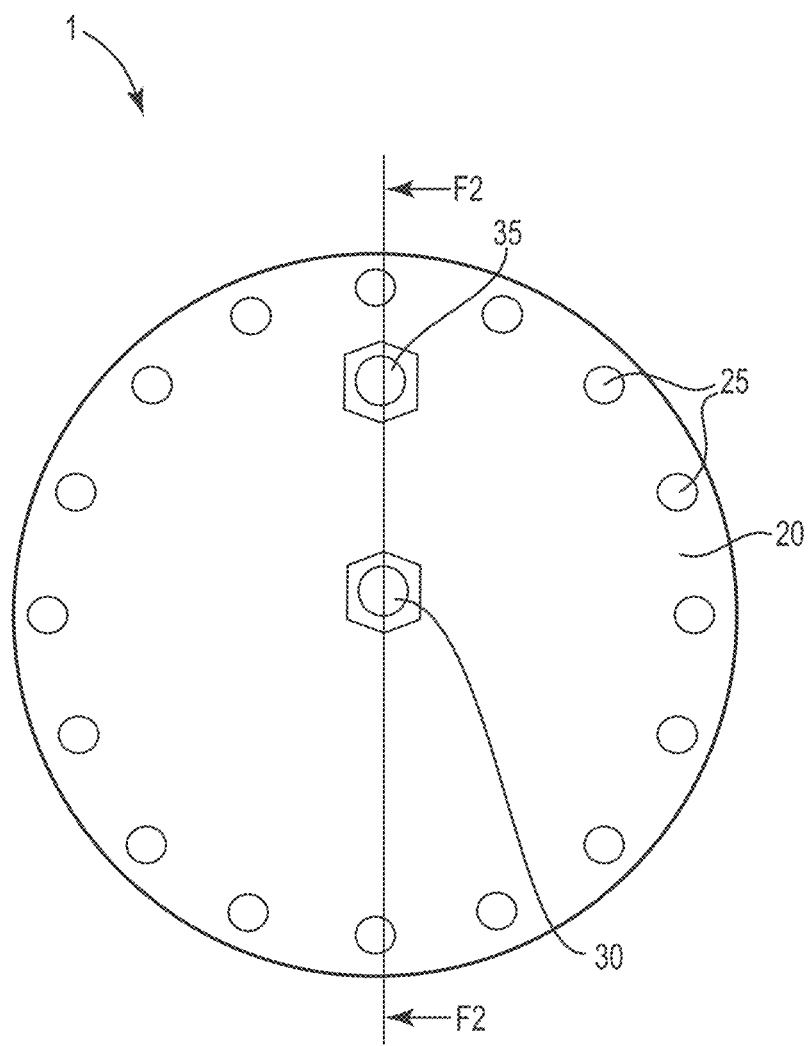

A vaporization vessel, according to the invention is described in FIG. 1A. FIG. 1A is a side view of a vaporization vessel 1 according to one embodiment. FIG. 1B is a top view of the vaporization vessel of FIG. 1A. The vaporization vessel 1 includes a container 10 and a cover 20. The cover 20 has a circular shape. However, the cover 20 in an embodiment may have a different shape (e.g., rectangular, square, or triangular, etc.). The container and cover 20 form a housing of the vaporization vessel 1. Bolts 25 affix the cover 20 to the container 10. An inlet 30 and an outlet 35 are provided in the cover 20. A seal member 27 is located between the container 10 and the cover 20. The seal member 27 is configured to provide sealing between the upper end of the container 10 and the cover 20. The seal member 27 is made of a material that has low to no particle shedding and is generally unreactive with the reagent. In an embodiment, the seal member 27 may be a metal sealing ring or an elastomer gasket. For example, the elastomer gasket may be formed of, but is not limited to, one or more FKM fluoroelastomers and/or FFKM perfluoroelastomers, as defined by ASHM international standard 1418. For example, the metal sealing ring may include stainless steel, nickel, or a metal coated with a soft material that is chemically compatible with the container and the reagent. For example, an elastomeric material is chemically compatible when it does not generate (through reacting with the carrier gas, the reagent, and/or the container, or by losing material) a detectable level of impurities when used in a vaporization vessel (e.g., cause an increase of 1 ppm or greater of impurities in the stream of reagent gas flowing from the vaporization vessel 1 relative to the vaporized reagent in the stream of reagent gas).

Figure 2:
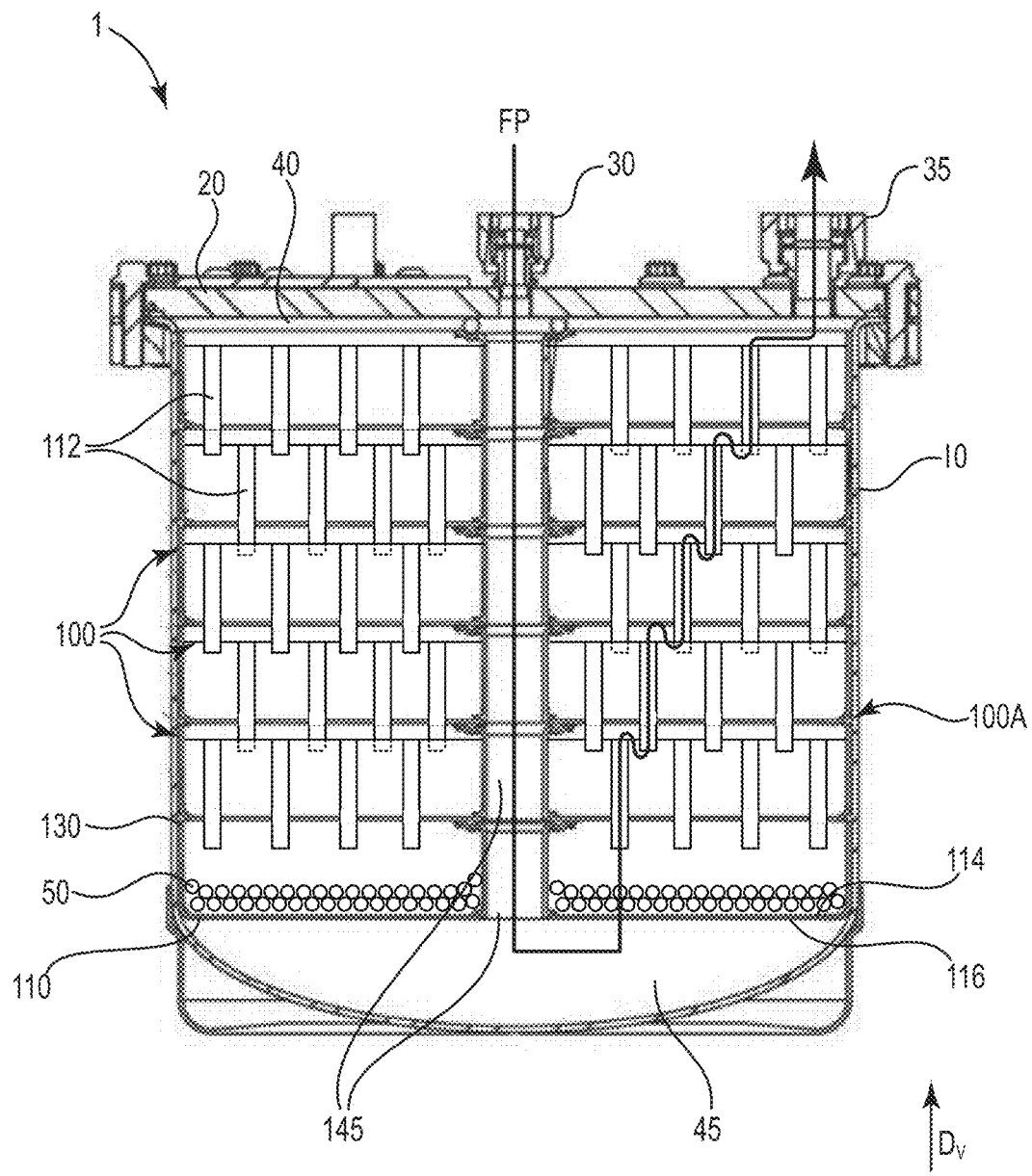
FIG. 2 is a cross-sectional view of the vaporization vessel in FIGS. 1A and 1B along the line F2-F2 in FIG. 1B.

FIG. 2 is a cross-sectional view of the vaporization vessel 1 along the line F2-F2 in FIG. 1B. The vaporization vessel 1 has an interior volume 40 defined by the housing. For example, the container 10 and the cover 20 define the interior volume 40 in an embodiment. The inner surfaces of the container 10 and the cover 20 may be made of a corrosion resistant material. For example, the inner surfaces of the container 10 and cover 20 may be, but are not limited to, made of stainless steel (e.g., 316L SS).

The vaporization vessel 1 includes trays 100 configured to hold a solid reagent 50. For illustration purposes, the internal structure of the lowest tray 100A is omitted to show the solid reagent 50. However, it should be understood that the trays 100 have similar features and the solid reagent 50 would be provided in each of the trays 100. The solid reagent 50 is shown as granules in FIG. 3. However, the solid reagent 50 may be any non-gas substance or material in an embodiment. For example, the solid reagent 50 may be particles (sintered or non-sintered), powder, or a liquid in embodiments. The vaporization vessel 1 in FIG. 2 has six trays 100. The trays 100 are stacked within the interior volume 40 in the vertical direction $D_v$. In an embodiment, the vaporization vessel 1 may include one or more of the trays 100. In another embodiment, the vaporization vessel 1 may include two or more of the trays 100.

Each tray 100 includes a bottom plate 110 with an upper surface 114 and a lower surface 116, and through-holes 112 that extend through the bottom plate 110. The interior volume 40 includes a lower portion 45 located below the trays 100. The trays 100 include ducts 145 for forming a passageway that allows carrier gas to flow from the inlet 30 to the lower portion 45 of the interior volume 40. The carrier gas then flows to the outlet 35 as shown by the flow path FP in FIG. 2. In an embodiment, a tube (not shown) may extend from the inlet 30 to the lower portion 45, and the carrier gas at the inlet 30 flows through the tube to reach the lower portion 45. In an embodiment, the locations of the inlet 30 and outlet 35 may be reversed. In such an embodiment, the flow path FP in FIG. 2 would also be reversed. Accordingly, it should be appreciated that for such an embodiment that the descriptions provided below with respect to the flow of gas, the inlet 30, and/or the outlet 35 would be modified to generate a stream of reagent gas with lower metal impurities. Structural features of the tray 100 in various embodiments are described in more detail below.

In an embodiment, the reagent is a metal halide. For example, the reagent may be at least one of aluminum chloride, tungsten chloride, silicon iodide, cadmium chloride, and tantalum chloride. In an embodiment, the reagent may be one of aluminum chloride and tungsten chloride. In an embodiment, the reagent may be an inorganic or organometallic solid capable of being vaporized with an inert gas in the vaporization vessel 1.

Figure 3:
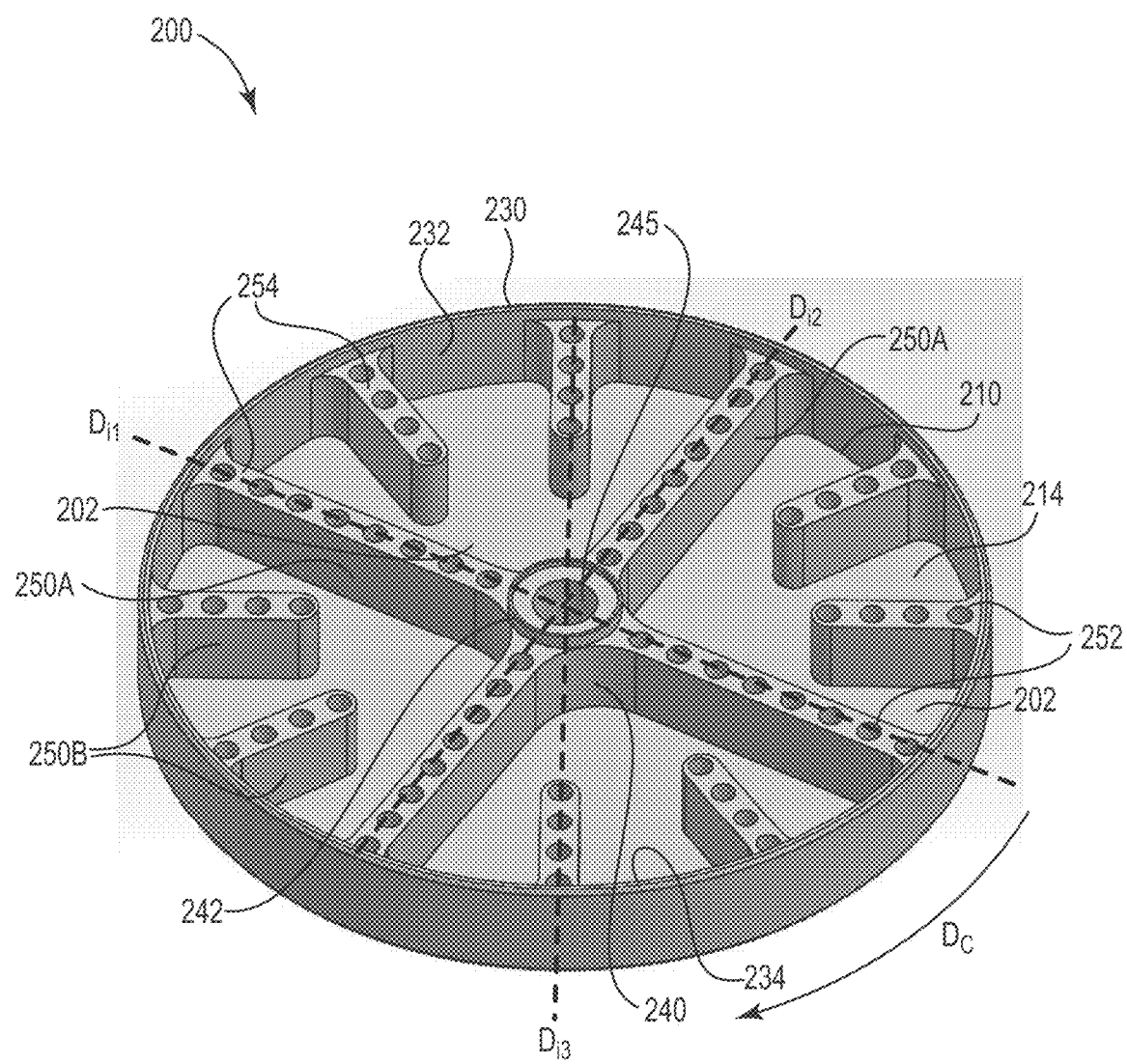
FIG. 3 is a prospective view of a tray for a vaporization vessel, according to an embodiment.
Figure 4:
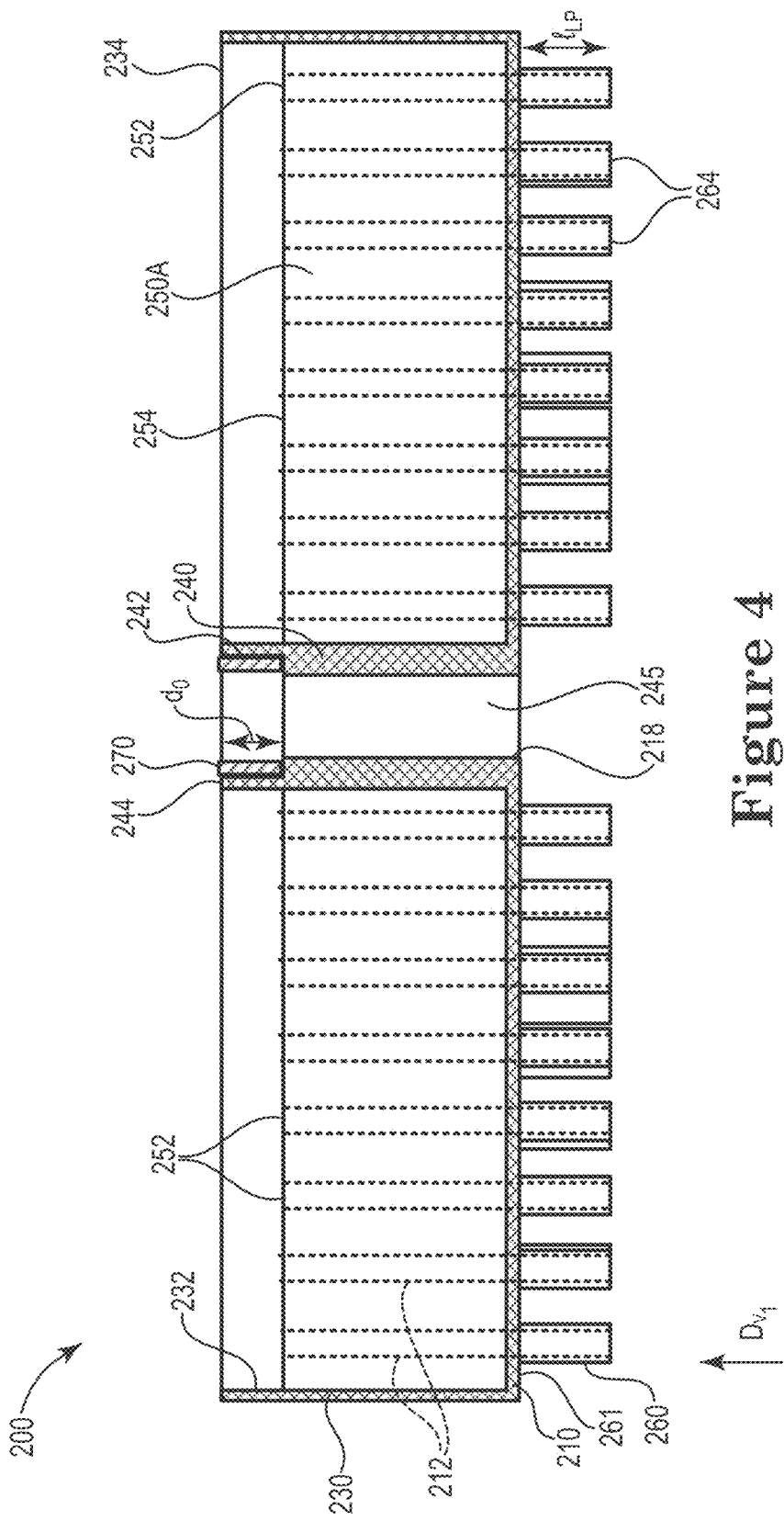
FIG. 4 is a cross sectional view of the tray in FIG. 3 along the diameter $Di_2$.

FIG. 3 is a prospective view of a tray 200 for a vaporization vessel (e.g., vaporization vessel 1). FIG. 4 is a cross-sectional view of the tray 200 along the diameter $D_{i2}$ in FIG. 3. The tray 200 includes a bottom plate 210, a side wall 230, a central duct 245 defined by an inner wall 240, and arms 250A, 250B, and through-holes 212. The tray 200 has an interior space defined by the bottom plate 210 and the sidewall 230. The bottom plate 210 in FIG. 3 is generally flat. However, it should be appreciated that the bottom plate 210 in an embodiment may have non-flat portions (e.g., curved portions, upwardly or downwardly extending portions, etc.)

As shown in FIG. 3, the tray 200 has four compartments 202 within the interior space defined by the side wall 230, the inner wall 240, and the arms 250A. In an embodiment, the tray 200 may have one or more compartments 202. The compartments 202 are configured to support and/or contain the solid reagent (e.g., solid reagent 50). The upper surface 214 of the bottom plate 210 is configured to contact and support the solid reagent. The arms 250A, 250B extend from the side wall 230. More specifically, the arms 250A, 250B extend between the side wall 230 and the inner wall 240. The arms 250A, 250B extend inwardly (i.e. within the interior space of the tray 200). The arms 250A, 250B extend along and are connected to the bottom plate 210. More specifically, the arms 250A, 250B extend along and are directly connected to the upper surface 214 of the bottom plate 210. The arms 250A, 250B include first arms 250A and second arms 250B. The tray 200 in FIG. 3 includes four of the first arms 250A and eight of the second arms 250B. In an embodiment, the tray 200 may include one or more of the arms 250A, 250B. In another embodiment, the tray 200 may include one or more of the first arms 250A, and one or more of the second arms 250B.

Each of the first arms 250A connects the side wall 230 to the inner wall 240. Each of the first arms 250A extends along a diameter of the tray 200 (e.g., diameter $D_{i1}$, diameter $D_{i2}$). The first arms 250A are provided in corresponding pairs, and the first arms 250A in each corresponding pair extend along the same diameter of the tray 200 (e.g., diameter $D_{i1}$, diameter $D_{i2}$). A first pair of the first arms 250A extends in a direction that is perpendicular to a direction in which a second pair of first arms 250A extends. However, in an embodiment, the tray 200 may include one or more the first arms 250A. In another embodiment, the one or more first arms 250A may be arranged in corresponding pairs and/or to extend along a diameter of the tray 200.

Each of the second arms 250B extends partially from the side wall 230 towards the inner wall 240 (i.e. does not directly connect to the inner wall 240). Each of the second arms 250B extends along a diameter of the tray 200 (e.g., diameter $D_{i3}$). One of the second arms 250B is provided between each pair of the first arms 250A that are adjacent. The second arms 250B are provided in corresponding pairs, and the second arms 250B in each corresponding pair extends along a same diameter of the tray 200 (e.g., diameter $D_{i3}$). However, in an embodiment, the tray 200 may include one or more of the second arms 250B. In another embodiment, the one or more second arms 250B may not be arranged in corresponding pairs and/or to extend along a diameter of the tray 200.

The bottom plate 210 has an upper surface 214 and a lower surface 216. The side wall 230 has an interior surface 232 and a top edge 234. The through-holes 212 extend through the bottom plate 210 to fluidly connect the space below the bottom plate 210 to the interior space of the tray 200. Tops 252 of the through-holes 212 are defined in the top surfaces 254 of the arms 250A, 250B. The compartments 202 are located below the tops 252 of the through-holes 212.

Accordingly, tops 252 of the through-holes 212 are configured to be located above the solid reagent such that the solid reagent cannot fall and/or flow through the through-holes 212.

The inner wall 240 forms the central duct 245 that extends from the bottom plate 210. The central duct 245 extends through the bottom plate 210 via a duct opening 218. The central duct 245 is in the center of the tray 200 in FIGS. 3 and 4. However, the central duct 245 does not have to be in the exact center of the tray 200 in an embodiment. When multiple of the trays 200 are stacked in the vertical direction $D_V$ within a vaporization vessel (e.g., vaporization vessel 1), the ducts 245 allow carrier gas to flow from an inlet of the vaporization vessel (e.g., inlet 30) to a lower portion of the internal volume of the vaporization vessel (e.g., lower portion 45 of the internal volume 40 in FIG. 2).

As shown in FIG. 4, the inner wall 240 defines a recess 242 for receiving a seal member 270. The seal member 270 in FIG. 4 is an O-ring. In another embodiment, the seal 270 may be an E-ring. The seal member 270 contacts the tray above (e.g., the lower surface of the tray above). The seal member 270 can provide a support surface for a second tray (e.g., a tray with a similar structure to the tray 200) stacked on the tray 200. In an embodiment, the second tray can have a similar configuration as the first tray 200. In an embodiment, the second tray may have a similar configuration to the first tray 200 except for having a different height than the first tray 200. The height of the tray 200 being measured along the direction $D_V$ in FIG. 2. The seal member 270 provides sealing between the duct 245 of the tray 200 and a duct of the second tray. For example, the seal member 270 provides sealing between the inner wall 240 and a lower surface (e.g., the lower surface 216) of the second tray. When the tray 200 is the top tray in the vaporization vessel (e.g., vaporization vessel 1), the seal member 270 contacts the cover of the vaporization vessel (e.g., cover 10) and provides sealing between the duct 245 and the inlet of the vaporization vessel (e.g., inlet 30). The seal member 270 is configured to prevent carrier gas from flowing directly from the duct 245 to the interior space of the tray 200. The duct 245 in an embodiment is defined by the seal member 270, the inner wall 240, and the duct opening 218 in the bottom plate 210.

In another embodiment, the inner wall 240 may not include the recess 242. In such an embodiment, the upper edge 244 of the inner wall 240 is configured to contact the second tray stacked on the tray 200 or the cover 10. In such an embodiment, the inner wall 240 extends higher than the top edge 234 of the side wall 230 (e.g., similar to the seal member 270 in FIG. 4) to ensure that the inner wall 240 provides sealing between the duct 245 and the duct of the second tray or the inlet (e.g., inlet 30). A small gap may be formed between the top edge 234 of the side wall 230 and the lower surface of the second tray.

As shown in FIG. 4, each of the through-holes 212 may include a lower portion 260 that is connected to and extends from the lower surface 216 of the bottom plate 210. The lower openings 264 of the through-holes 212 are located in the ends of the lower portion 260 opposite to the bottom plate 210. As shown in FIG. 4, the through-holes 212 extend below the lower surface 216 of the bottom plate 210. A length $l_{LP}$ of the lower portion 260 is greater than a distance $d_O$ (in the vertical direction $D_{V1}$) from a top of a corresponding through-hole 212 to the top of the tray 200 (e.g., to the upper surface of a seal member 270 when compressed, to the top edge 244 of the inner wall 240). As such, when a second tray (e.g., a tray with a similar structure to the tray 200) is stacked on the tray 200, carrier gas flowing from the through-holes 212 must flow downward (i.e. opposite to the vertical direction $D_{V1}$) and closer to the solid reagent (e.g., solid reagent 50) to flow into the through-holes of the second tray. For example, FIG. 2 shows the flow path FP for carrier gas, and how the carrier gas has to flow downward when it flows from one tray 100 to the next. It should be appreciated that the tray 200 in an embodiment may not include the lower portions 260. In such an embodiment, the through-holes would extend through the bottom plate 210 to the lower surface 216 of the bottom plate 210.

The seal 270 is made of an elastomeric material configured to be chemically compatible with the carrier gas and the vaporized reagent. For example, an elastomeric material is chemically compatible when it does not generate (through reacting with the carrier gas or reagent, or by losing material) a detectable level of impurities when used in a vaporization vessel. For purposes of this invention, a non-detectable level of impurities can be, less than ten part per million ("ppm") of metal impurities relative to the amount of vaporized reagent, or less than three ppm of metal impurities relative to the amount of vaporized reagent, or one ppm of metal impurities relative to the amount of vaporized reagent. In an embodiment, the elastomeric material of the O-ring 270 may include one or more FKM fluoroelastomers and/or FFKM perfluoroelastomers.

The tray 200 in FIG. 3 is in a first position. The tray 200 may be rotated by 45 degrees in the circumferential direction $C_D$ to reach a second position. The tray 200 is configured such that none of the through-holes 212 in the second position overlap with a position of one of the through-holes 212 when in a first position. As discussed above, a plurality of the trays 200 are configured to be stacked in a vertical direction $D_V$ within the internal volume of a vaporizing vessel (e.g., the interior volume 40 of the vaporizing vessel 1). A first tray 200 is configured to be rotated relative to a second adjacent tray 200. For example, the second adjacent tray 200 is a tray stacked on the first tray 200 or a tray on which the first tray 200 is stacked. In an embodiment, the first tray 200 is rotated by 45, 135, 225, or 315 degrees relative to the second adjacent tray. Accordingly, none of the through-holes 212 in the first tray 200 overlaps with one of the through-holes 212 in a second adjacent tray 200 in the vertical direction $D_V$. As such, carrier gas must flow in at least one of a radial direction or a circumferential direction to flow from the through-holes 212 of the first tray 200 to the through-holes 212 of the second tray 200. When flowing in the circumferential direction and/or radial direction, the carrier gas flows along the solid reagent (e.g., solid reagent 50), which advantageously results in the generated stream of reagent gas more efficiently vaporizing the solid reagent and/or having a larger concentration of vaporized reagent.

In an embodiment, the tray 200 can be made of a material comprising aluminum alloy. In particular, the interior surface(s) of the tray 200 (e.g., the upper surface 214, the inner surface 232, the surfaces of the arms 250A, 250B, the outer surface of the inner wall 240) are made of aluminum alloy. The aluminum alloy is configured to contact the solid reagent without significantly reacting with the reagent as a solid or vapor. In an embodiment, the aluminum alloy of the tray 200 is configured to be substantially unreactive with the reagent. For example, the aluminum alloy is substantially unreactive as it does not generate (through reacting with the carrier gas or reagent, and/or by losing material) a detectable level of impurities when used in a vaporization vessel (e.g., cause an increase of 1 ppm or greater of impurities in the stream of reagent gas flowing from the vaporization vessel 1 relative to the vaporized reagent in the stream of reagent gas).

In an embodiment, the aluminum alloy advantageously does not significantly react (i.e. is substantially unreactive) with a metal halide reagent. For example, the solid reagent is aluminum chloride and the aluminum alloy of the tray 200 advantageously does not substantially react with the solid or vaporized aluminum chloride. Thus, the stream of vaporized reagent produced using the tray 200 has a limited concentration of impurities. In another embodiment, a coating is applied to the aluminum alloy tray to limit reaction with the precursor material and impurity transport.

The bottom plate 210, the sidewall 230, inner wall 240, and arms 250A, 250B are a single continuous piece. In an embodiment, the tray 200 is formed by machining a single piece of material. However, it should be appreciated that the tray 200 in an embodiment may be configured such that the arms 250A, 250B are non-destructibly removable as discussed below regarding tray 500.

Figure 5A:
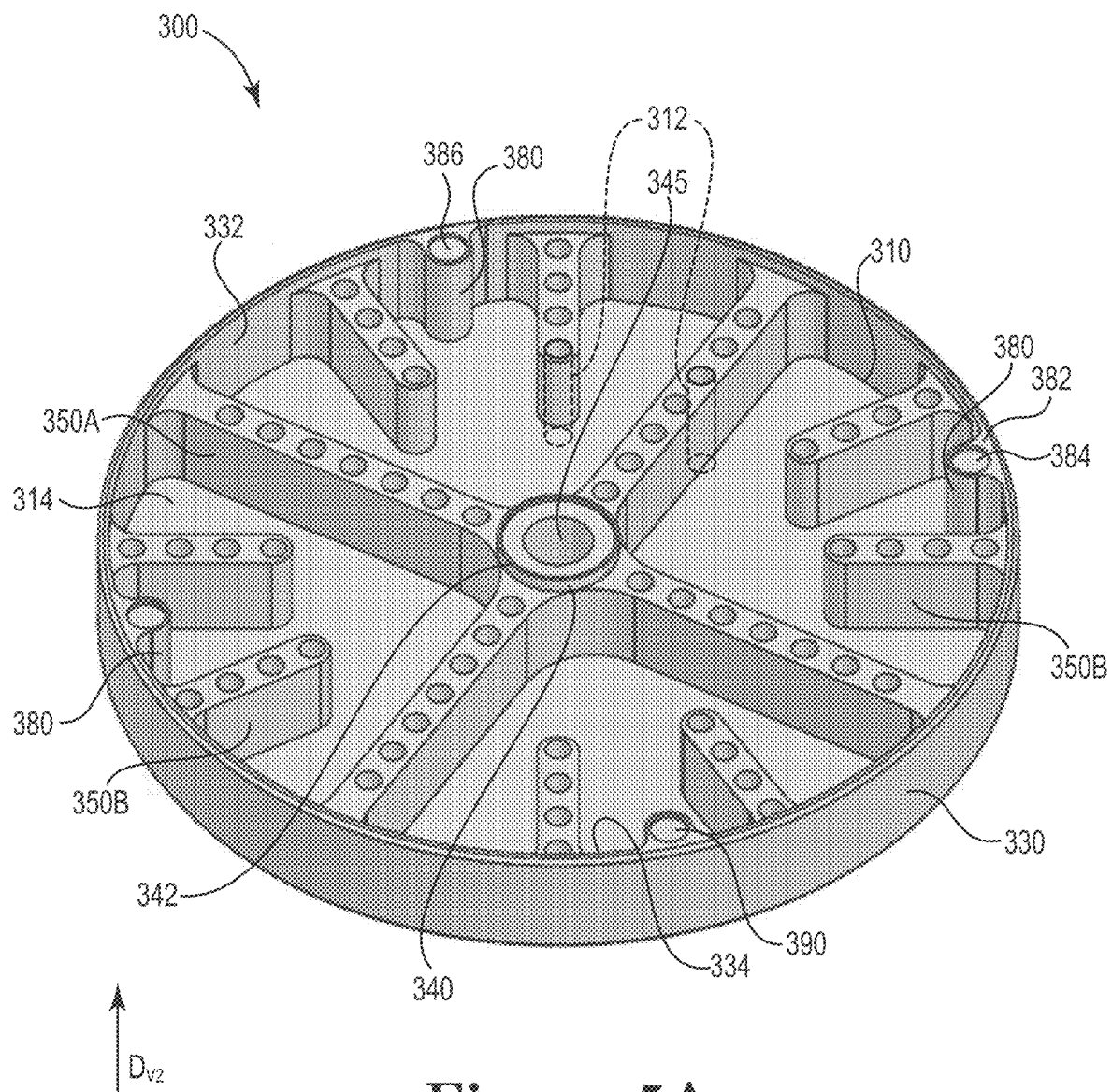
FIG. 5A is a prospective view of a tray for a vaporization vessel, according to another embodiment.

FIG. 5A is a prospective view of a tray 300 for a vaporization vessel (e.g., vaporization vessel 1). The tray 300 includes a bottom plate 310, through-holes 312, a sidewall 330, a central duct 345 defined by an inner wall 340, and arms 350A, 350B. The duct 345 extends through the tray 300 similar to the duct 245 in FIGS. 3 and 4.

The tray 300 having an interior space defined by the bottom plate 310 and the sidewall 330. More particularly, the interior space is defined by the bottom plate 300, the sidewall 330, and the inner wall 340. The tray 300 in an embodiment may also include lower portions (not shown in FIG. 5A) similar to the lower portions 260 of tray 200 and as discussed above.

The arms 350A, 350B of tray 300 have a similar configuration as discussed above regarding tray 200. In an embodiment, the arms 350A, 350B may be modified in a similar manner (e.g., number, positioning) as discussed above regarding arms 250A, 250B. For example, the tray 300 in an embodiment may include one or more of the arms 350A, 350B. For example, the tray 300 in an embodiment may include one or more of the first arms 350A, and one or more of the second arms 350B.

The through-holes 312 of the tray 300 are also configured in a similar manner to the through-holes 212 of tray 200. In particular, the tray 300 is configured so that when it is rotated by a specific amount in the circumferential direction (e.g., by 45 degrees, by 135 degrees), such that none of the through-holes 312 in the rotated position overlaps with a position of one of the through-holes 312 in the pre-rotated position.

In another embodiment to reduce the level of impurities, the vaporization vessel or parts of the vaporization vessel (i.e. tray) is coated with graphite or made of graphite, the tray 300 is made of a material comprising graphite and/or treated graphite. In an embodiment, treated graphite is graphite that has been surface treated.

For example, a surface treatment for the vaporization vessel or trays coated with graphite can be a pyrolytic treatment that provides a pyrolytic coating that seals the graphite. In certain examples, the pyrolytic treatment uses pyrolytic carbon to trap the graphite particles and coat the tray with graphite. In such embodiments, the tray is comprised of polycrystalline graphite with an amorphous carbon content not less than 20% or more than 80% of the volume. The graphite will have a particle size averaging between 1-micron and 12-micron and a volumetric density between 1.50 g/cm3 and 1.90 g/cm3. Surrounding the graphite will be a pyrolytic carbon treatment that infiltrates the near surface porosity to a depth of 0.1" and provides a maximum coating thickness on top of the graphite of 50-micron. The graphite treatment on the trays allows for reduced amount of detectable impurities relative to the amount of vaporized agent (see Table 1 below).

In an embodiment, the bottom plate 310, sidewall 330, inner wall 340, arms 350A, 350B are made of graphite. In an embodiment, the bottom plate 310, sidewall 330, inner wall 340, and arms 350A, 350B are made of a single continuous piece of graphite.

In some embodiments in which the trays are coated or made of graphite, the tray 300 includes contacting structures 380 that can decrease rubbing between the tray 300 and a similar tray stacked on the tray 300.

In an embodiment, the tray or vaporization vessel can be made of or coated with nickel. The nickel material is chemically compatible with a metal halide reagent to reduce the level of detectable impurities. The trays or vaporization vessel can be coated using deposition techniques, including but not limited to, chemical vapor deposition, physical vapor deposition, sputter deposition, and any other related technique known in the relevant art. In an embodiment, using sputtering deposition to coat the nickel material on a graphite tray, the level of impurities significantly decreases.

Table 1 shows the comparison of the level of iron (impurities) detected relative to the vaporized reagent, in a stainless steel vaporization vessel compared to a vaporization vessel that is coated with nickel or graphite. In this example, the transportation of the vaporization vessel at 40 Torr, 200 sccm Ar carrier gas, and 150 degrees C. The solid reagent was a metal halide reagent (WC16).

TABLE 1

| | With stainless steel | Transport 1 (Ni/Graphite) | Transport 2 (Ni/Graphite) | Transport 3 (Ni/Graphite) | Transport 4 (Ni/Graphite) | Transport 15 (Ni/Graphite) |
| --- | --- | --- | --- | --- | --- | --- |
| Iron | 256.1 | 1.8 ppm | 1.3 ppm | 1.2 ppm | 1.1 ppm | 0.6 ppm |

The contacting structures 380 are located along an inner surface 332 of the sidewall 330. The tray 300 in FIG. 5A has four contacting structures 380, as an example. In an embodiment, the tray 300 may include two or more of the contacting structures 380. In another embodiment, the tray 300 may include four or more of the contacting structures 380. Each contacting structure 380 in FIG. 5A is directly connected to the upper surface 314 of the bottom plate 310 and the inner surface 332 of the side wall 330. However, the contacting structure(s) 380 in an embodiment may be located near the side wall 330 (e.g., closer to the side wall 330 than to the inner wall 340) without being directly connected to the side wall 330.

Each of the contacting structures 380 has an upper surface 382 for an elastic member 390. For illustration purposes, the elastic member 390 is omitted from one of the contacting structures 380 in FIG. 5A. As shown in FIG. 5A, the upper surface 382 of the contacting structure 380 includes an inset portion 384 for holding the elastic member 390. Each of the elastic members 390 extends upwardly (e.g., in a vertical direction $D_{V2}$) beyond the top edge 334 of the side wall 330. The elastic members 390 are made of an elastomeric material that is chemically compatible with the carrier gas and the vaporized reagent. In an embodiment, the elastic member 390 is made of an elastomeric material as similarly discussed above regarding the seal member 270.

As discussed above, tray 300 is configured so that when it is rotated by a specific amount in the circumferential direction (e.g., by 45 degrees, by 135 degrees), none of the contacting structures 380 in the rotated position overlaps with a position of one of the through-holes 312 in the pre-rotated position. Accordingly, when a second tray with a similar configuration to tray 300 is stacked on the tray 300, none of the through-holes in the second tray overlaps with any of the contacting structures 380 of the tray 300.

The contacting structures 380 can provide support surfaces for a second tray stacked on the tray 300, while reducing the amount of rubbing between the non-elastomer surfaces of the tray 300 and the lower surface(s) of the tray stacked above. In particular, the contacting structures 380 may be advantageous when the surfaces of the tray 380 are made of a material with low abrasion resistance.

The inner wall 340 includes a recess 342 for receiving a seal member (e.g., the seal member 270). The seal member would be provided in the recess 342 in tray 300 in a similar manner described above for tray 200 in FIG. 4. The duct 345 and the seal member forming a passageway that allows carrier gas to pass all the way through the tray 300. The seal member provides sealing between the duct 345 and the duct of a second tray stacked on tray 300. In an embodiment, the seal member and the inner wall 340 have a similar configuration as described above for the seal member 270 and inner wall 340 in FIG. 4.

Figure 5D:
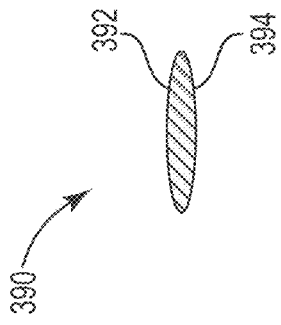
FIGS. 5B, 5C, and 5D are a top view, a cross sectional view, and a second cross sectional view of the elastic member in FIG. 5A, respectively.
Figure 5C:
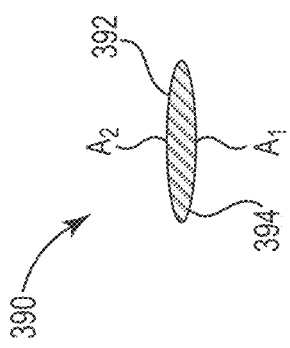
Figure 5B:
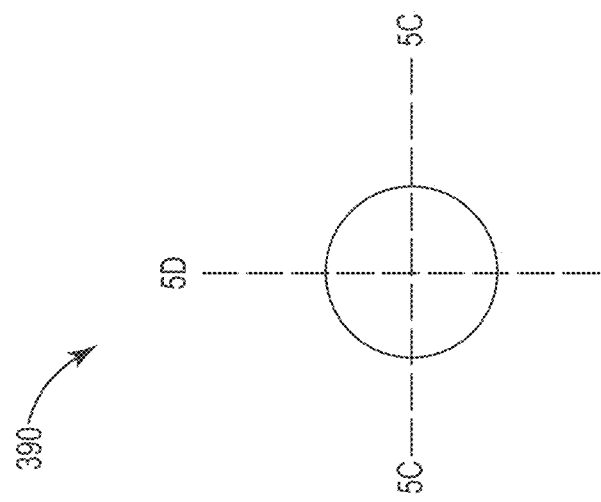

FIG. 5B is a prospective view of the elastic member 390 in FIG. 5A. FIG. 5C is a cross-sectional view of the elastic member 390 in FIG. 5B along line 5C-5C. FIG. 5D is a cross-sectional view of the elastic member 390 in FIG. 5B along line 5C-5C. The elastomeric member 390 is configured to not create a virtual leak when compressed between trays or a tray and the cover of the vaporization vessel (e.g., cover 10). As shown in FIGS. 5D and 5C, the elastic member 390 has a lenticular shape. More specifically, each of an upper surface 392 and a lower surface 394 of the elastic member 390 is convex. An apex $A_1$ of the convex lower surface 394 and an apex $A_2$ of the convex upper surface 392 contact the tray 300 and a second tray stacked on the tray 300. Accordingly, the elastic member 390 does not create a virtual leak when compressed.

Figure 6A:
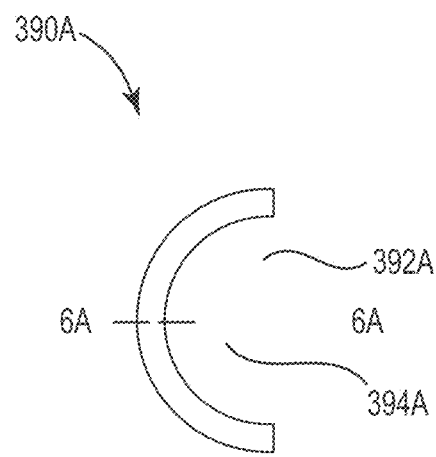
FIGS. 6A and 6B are a top view and cross sectional view, respectively, of an elastic member for the vaporization tray in FIG. 5A, according to another embodiment.
Figure 6B:
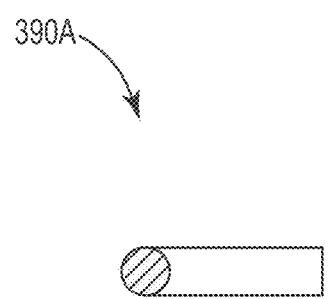

FIG. 6A is a prospective view of a further embodiment 390A of the elastic member. FIG. 6B is a cross-sectional view of the elastic member 390A in FIG. 6A along line 6B-6B. FIGS. 6A and 6B illustrate an alternative shape for the elastic member 390 in FIGS. 5A-5D. The elastic member 390A is a partial o-ring. More specifically, the elastic member 390A is a half o-ring. In an embodiment, the elastic member 390A is placed in the recess of the inset portion 384 of the tray 300. The elastic member 390A has an opening 392A that remains open even when the elastic member 390A is compressed between stacked trays. When the elastic member 390A is compressed, the opening 392A allows gas in a central space 394A of the elastic member 390A to escape. Accordingly, the elastic member 390A does not create a virtual leak when compressed.

FIG. 6A is a prospective view of an embodiment of a tray 400 for a vaporization vessel (e.g., vaporization vessel 1).

The tray 400 includes a bottom plate 410, a side wall 430, a duct 445 defined by an inner wall 440, and a plurality of tubes 450. FIG. 6B is view of one of the tubes 450 in FIG. 6A along the bottom plate 410. The bottom plate 410 includes an upper surface 414, a lower surface 416, and apertures 422. The apertures 422 extend through a width $W_P$ of the bottom plate 410 (e.g., from the upper surface 414 to the lower surface 416). A tube 450 has a top 452, a lower opening 464, and an outward projection 455. The outward projection 455 has an outer shape (e.g., outer diameter) that is configured for being press-fit into one of the apertures 422 of the bottom plate 410.

The tray 400 is assembled by the outward projection 455 of each tube 450 being press-fit into a respective one of the apertures 422 of the bottom plate 410. Each press-fit tube 450 is then welded to the bottom plate 410. The outward projection 455 advantageously allows a seam 480 between a tube 450 and the bottom plate 410 to not be along the vertical surface 467 of the tube 450 (e.g., a direction across the seam 480 is along a plane of the bottom plate 410). More specifically, the outward projection spaces apart (e.g., by a distance $d_s$) the seam 480 and the vertical surface 467 of the tube 450, when the tray 400 is viewed along the vertical direction $D_V$. This spacing allows the tubes 450 to be welded in a direction $D_P$ that is perpendicular to the upper surface 414. The distance $d_s$ may be based on, for example, but not limited to, the width $W_P$ of the bottom plate 410. In an embodiment, the distance $d_s$ from the vertical surface 467 of the tube 450 to the seam 480 may be equal to or greater than 0.5 the thickness $W_P$ of the bottom plate 410 (i.e., $d_s \geq 0.5 W_P$). Because the tubes 450 are adequately spaced apart from each other, the side wall 430 and the inner wall 440 allow for an adequate amount of purge gas to be provided during welding such that the weld surface can be kept clean, which lowers impurity formation at the weld. For example, the spacing of the seam 480 allows for the tubes 450 to be welded to the bottom plate 410 using laser welding. For example, the laser welding may be, but is not limited to, $CO_2$ laser welding and E-beam welding. The configuration of the tubes 450 also allows for automated laser welding (e.g., $CO_2$ laser welding, E-beam welding) to be used to weld the tubes 450 to the tray 400.

Each tube 450 also includes an upper portion 465 that extends above the upper surface 414 of the bottom plate 410 and a lower portion 460 that extends below the lower surface 416 of the bottom plate 410. The upper portion 465 has a length $l_{UP1}$ and the lower portion 460 has a length $l_{LP2}$. In a similar manner as discussed above regarding the length $l_{LP}$ of the lower portion 260 in FIG. 4, the length $l_{LP2}$ of the lower portion 460 is configured to be larger than a distance doi between a top 452 of a corresponding through-hole 412 and the top edge 434 of the side wall 430. The distance $d_{O1}$ is along the vertical direction $D_{V3}$. Accordingly, when multiple of the trays 400 are stacked on each other in the vertical direction $D_{V3}$ within a vaporizer vessel (e.g., vaporization vessel 1), the carrier gas flowing from the upper openings 464 of tubes 450 in a lower tray flows downward (e.g., in the vertical direction $D_{V3}$) before flowing into the tubes 450 of an upper tray.

A flange 442 extends from the upper end of the inner wall 440. The flange 442 includes an inset surface 444 for an attaching a seal (e.g., seal 270 in FIG. 4) that provides sealing between the duct 445 and a duct 445 of a second tray stacked on the tray 400. In a similar manner to the seal 270, a seal would extend above a top edge 434 of the side wall 430.

The tray 400 is composed of a metal material. In certain embodiments of the invention, the tray 400 can be made of a material comprising stainless steel (e.g., 316L stainless steel). Aluminum alloys, graphite, or nickel.

As discussed above, a plurality of the trays 400 may be stacked in a vertical direction $D_V$ within a vaporizing vessel (e.g., within the interior volume 40 of the vaporizing vessel 1 in FIGS. 1A-B). When the trays 400 are stacked within the vaporizing vessel, each tray 400 is configured to be rotated (e.g., rotated in the circumferential direction $D_{C1}$) relative to an adjacent tray 400 (e.g., a second adjacent stacked on the first tray 400, a second adjacent tray on which the first tray 400 is stacked). For example, the tray 400 as shown in FIG. 6A is in a first position, an adjacent tray 400 would have second position, and different between the first position and the second position is a rotation of 180 degrees. The tray 400 is configured such that when rotated by 180 degrees, none of the through-holes 412 overlap with a position of the through-holes 412 before the tray 400 was rotated. Accordingly, none of the through-holes 412 of a first tray 400 overlaps with a through-hole 412 of an adjacent second tray 400 in the vertical direction $D_V$. As such, carrier gas must flow in at least one of a radial direction or a circumferential direction to flow from the through-holes 412 of the first tray 400 to the through-holes 412 of the second adjacent tray 400. When flowing in the circumferential direction and/or radial direction, the carrier gas flows along the solid reagent (e.g., solid reagent 50), which advantageously results in the generated stream of reagent gas more efficiently vaporizing the solid reagent and/or having a larger concentration of vaporized reagent.

Figure 8A:
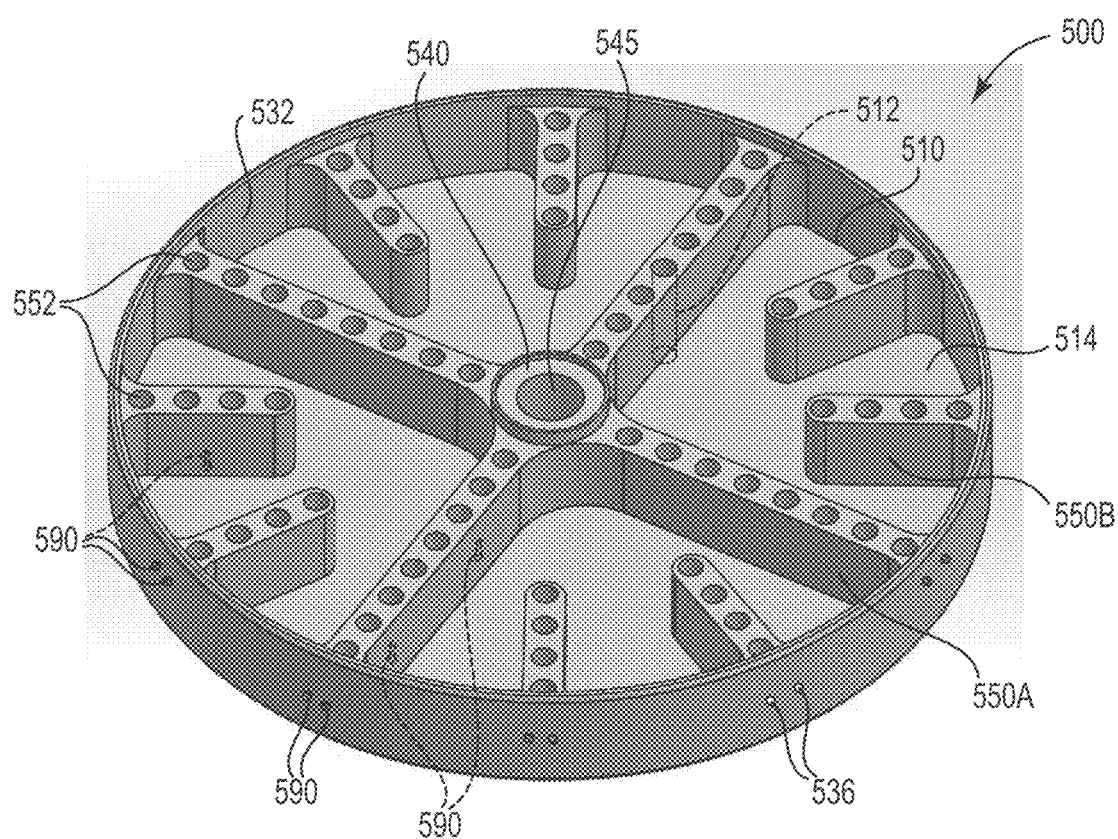
FIG. 8A is a prospective view of a tray for a vaporization vessel, according to an embodiment.

FIG. 8A is a prospective view of an embodiment of a tray 500 for a vaporization vessel (e.g., vaporization vessel 1). Similar to the tray 300, the tray 500 includes a bottom plate 510 with an upper surface 514, a side wall 530, a central duct 545 defined by an inner wall 540, and arms 550A, 550B. The tray 500 has a lower surface (not shown in FIGS. 8A and 8D) similar to tray 200 (e.g., lower surface 216). The tray 500 includes an interior space defined by the bottom plate 510 and the side wall 530. More specifically, the interior space is defined by the bottom plate 510, the side wall 530, and the inner wall 540.

Figure 8B:
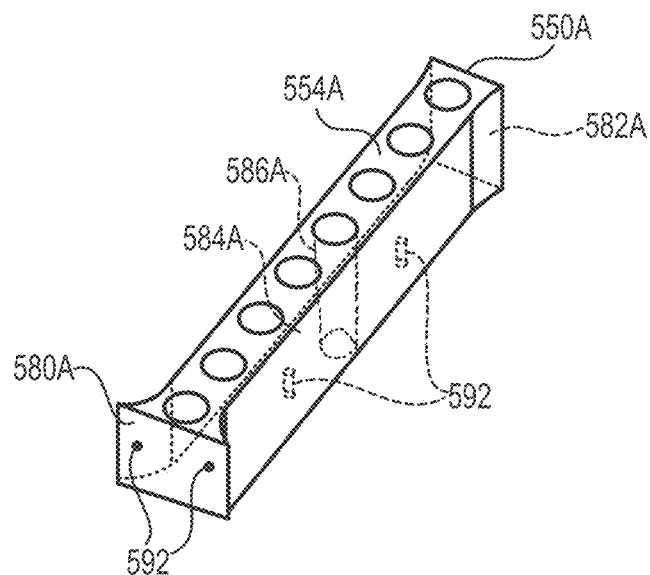
FIGS. 8B and 8C are each a prospective view of a respective arm of the tray in FIG. 8A.
Figure 8C:
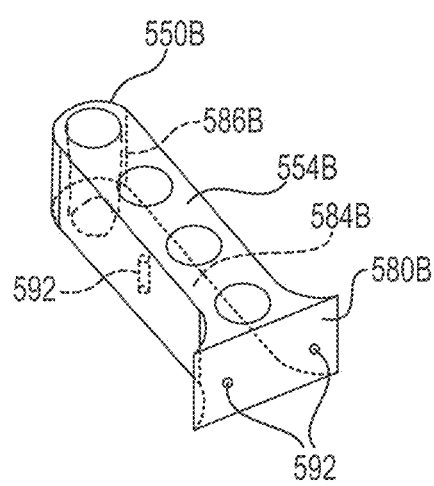
Figure 8D:
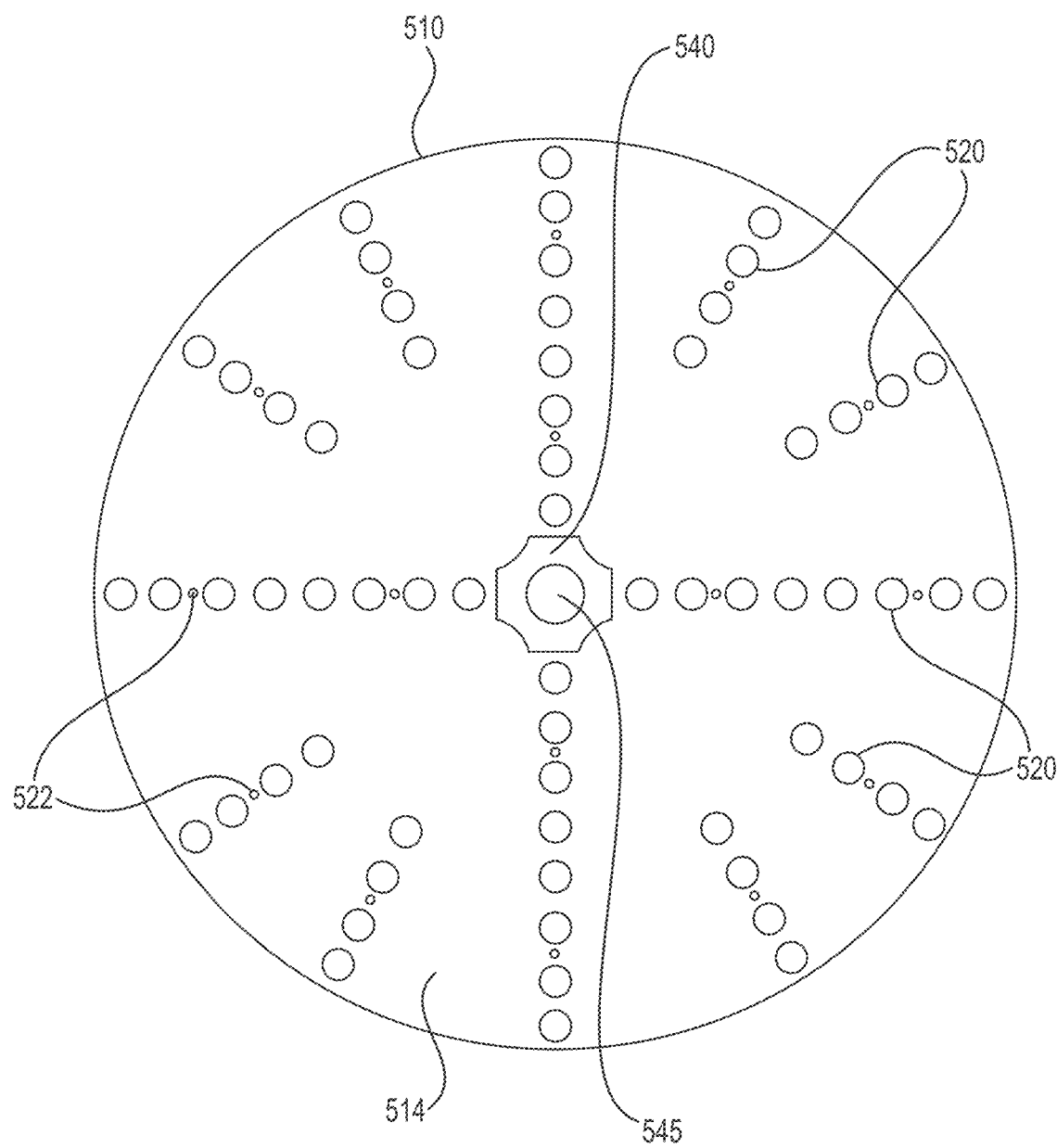
FIG. 8D is a top view of the tray in FIG. 8A without the arms.

The arms 550A, 550B are separately formed then secured within the interior space of the tray 500 by screws 590. The arms 550A, 550B include first arms 550A and second arms 550B in a similar arrangement as the arms 250A, 250B of tray 200. FIG. 8B shows a prospective view of one of the first arms 550A. FIG. 8C shows a prospective view of one of the second arms 550B. FIG. 8D is a top view of the tray 500 without the arms 550A, 550B. Dashed lines are provided in FIGS. 8B and 8C for illustrating edges and corresponding surfaces that would not be visible in their respective prospective views. The screws 590 extend through holes 536 in the side wall 530 or holes 522 in the bottom plate 510 to secure the arms 550A, 550B within the interior space.

As shown in FIG. 8B, a first arm 550A includes a first end 580A, a second end 582A, a top surface 554A, a bottom surface 584A, and apertures 586A. The apertures 586A extend through the first arm 550A (e.g., from the top surface 554A to the bottom surface 584A). The first arm 550A also includes screw-holes 592 in the first end 580A and the bottom surface 584A that are configured to receive a screw 590 for attaching the first arm 550A to the bottom plate 510 and the sidewall 530.

As shown in FIG. 8C, a second arm 550B includes a first end 580B, a top surface 554B, a bottom surface 584B, and apertures 586B. The apertures 586B extend through the second arm 550B (e.g., from the top surface 554B to the bottom surface 584B). The second arm 550B also includes screw-holes 592 in the first end 580B and the bottom surface 584B that are configured to receive a screw 590 for attaching the second arm 550B to the bottom plate 510 and the sidewall 530.

As shown in FIG. 8D, the bottom plate 510 includes apertures 520 and holes 522. Each of the holes 522 is for affixing an arm 550A, 550B to the bottom plate 510 with a screw. When the tray is assembled as shown in FIG. 8A, the tray 500 includes through-holes 512 that extend from at least the lower surface of the tray 500 to the interior space of the tray 500. Each through-hole 512 is formed by a respective one of the apertures 520 in the bottom plate 510 and a respective one of the apertures 586A in the arms 550A, 550B.

In an embodiment, the tray 500 may also include lower portions (not shown in FIGS. 8A-8D) similar to the lower portions 260 in FIG. 4. Each through-holes 512 is formed by one of the lower portions, one of the apertures 520 in the bottom plate 510, and a respective one of the apertures 586A, 586B in the arms 550A, 550B. For example, an upper portion of a through-hole 512 would be provided by an aperture 586A, 586B in an arm 550A, 550B, a middle portion of the through-hole 512 would be provided by an aperture 520 in the bottom plate 510, and a lower portion of the through-hole 512 would be provided by a lower portion (e.g., one of the lower portions 260 in FIG. 4). In such an embodiment, one of the lower portions may be affixed to the lower surface of the bottom plate 510. In another embodiment, the lower portions may be provided on the bottom surfaces 584A, 584B of the arms 550A, 550B and extend through the apertures 520 in the bottom plate 510.

The tray 500 in FIG. 8A is assembled by positioning the arms 550A, 550B on the bottom plate 510 within the tray 500, and inserting the screws 590 into each corresponding pair of screw-holes 592 and holes 522, 536 in the bottom plate 510 or side wall 530. In an embodiment, an arm 550A, 550B may have one or more screw-holes 592 in the first end 580A, 580B and the bottom surface 584A, 584B. In another embodiment, an arm 550A, 550B may have one or more screw-holes 592 in just the first end 580A, 580B. In such an embodiment, the bottom plate 510 would not include the holes 522.

Accordingly, the tray 500 has arms 550A, 550B which are (non-destructibly) removable. The removability of the arms 550A, 550B allows for better cleaning of the tray 500, which advantageously lowers impurity formation. In an embodiment, the arms 550A, 550B may be affixed by welding instead of by screws 590. In an embodiment, the arms 550A, 550B being affixed by welding can reduce virtual leaks caused by the tray 500 in which moisture from the cleaning of the tray 500 if present can be trapped and cause an increase impurity formation. In such an embodiment, the arms 550A, 550B would not be (non-destructibly) removable.

The tray 500 comprises a metal material. For example, the tray 500 may be made of a material comprising iron, aluminum, graphite, or stainless steel. In an embodiment, the tray 500 may be made of an aluminum alloy as discussed above regarding tray 200.

Figure 7A:
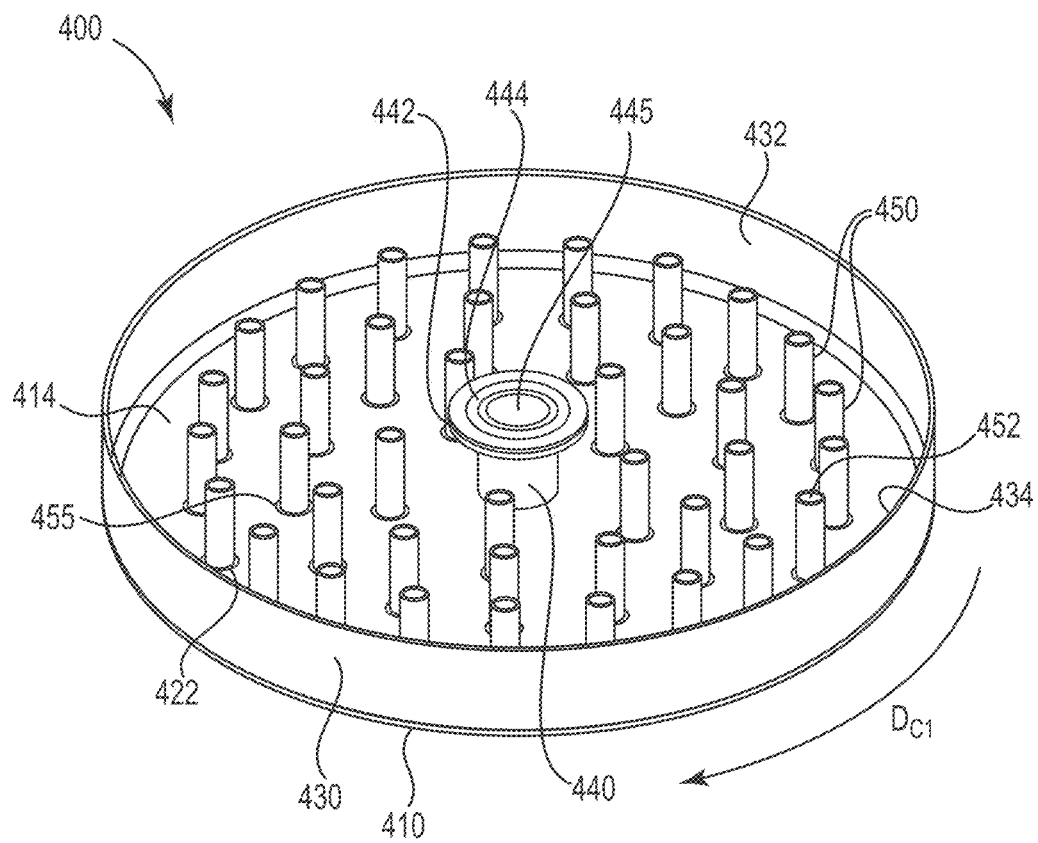
FIG. 7A is a prospective view of a tray for a vaporization vessel, according to another embodiment.
Figure 9A:
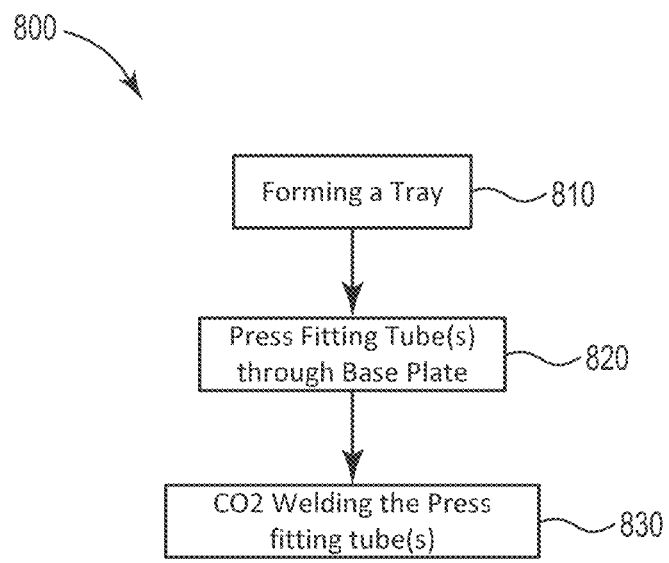
FIG. 9A is a method for forming a tray for a vaporization vessel, according to an embodiment.

FIG. 9A is a block diagram of a method 800 of assembling a tray (e.g., tray 400 in FIG. 7A) according to an embodiment. The method 800 starts at 810. At 810, a first tray portion is formed that includes a bottom plate (e.g., bottom plate 410), a side wall (e.g., side wall 430), an interior space defined by the bottom plate and the side wall, and one or more apertures (e.g., apertures 422) that extend through the bottom plate. The first tray portion in an embodiment may be formed by machining a single piece of material. In another embodiment, the first tray portion may be formed by attaching (e.g., welding) at least the side wall to the bottom plate. The method then proceeds to 820.

At 820, tubes (e.g., tubes 450) are press-fit through the apertures in the bottom plate. Each tube is press-fit into a respective one of the apertures in the bottom plate. Each tube includes an outward projection (e.g., outward projection) that extends around the tube. Each tube is press-fit such that its outward projection is positioned in its respective aperture in the bottom plate. Each press-fit tube includes an upper portion (e.g. upper portion 465) that extends into the interior space of the tray. In an embodiment, each press-fit tube may also include a lower portion (e.g., lower portion 465) that extends beyond the lower surface of the bottom plate (e.g., lower surface 416). The method then proceeds to 830.

Figure 7B:
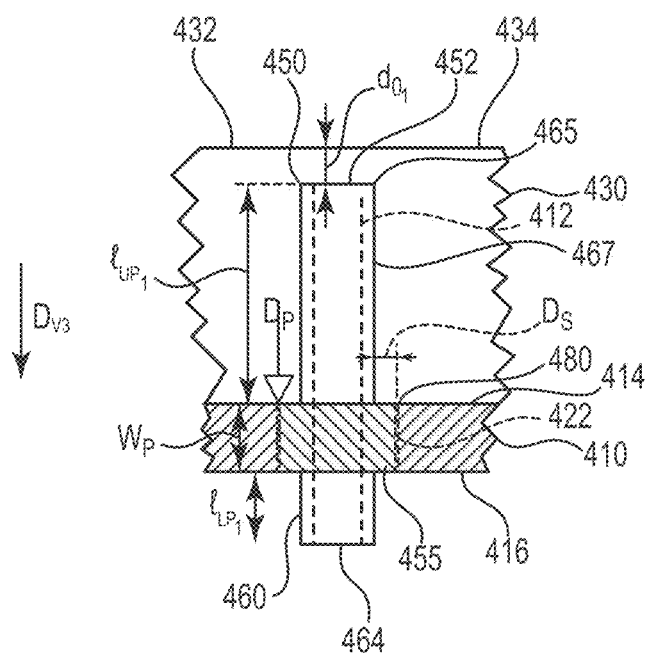
FIG. 7B is a cross sectional view of the tray in FIG. 7A that illustrates one of the tubes.

At 830, each of the press-fit tubes is welded to the bottom plate (e.g., $CO_2$ welded). As each of the tubes has an outward projection, the seam between each tube and the bottom plate (e.g., seam 480) is not along the vertical surface of the tube (e.g., vertical surface 467). For example, a direction across the seam is along a plane of the bottom plate. Each of the press-fit tubes is welded at an angle (e.g., along direction $D_p$ in FIG. 7B) that is perpendicular to an upper surface of the bottom plate (e.g., upper surface 414). The bottom plate and the tubes are made of a metal material so that the tubes can be welded to the bottom plate.

Figure 9B:
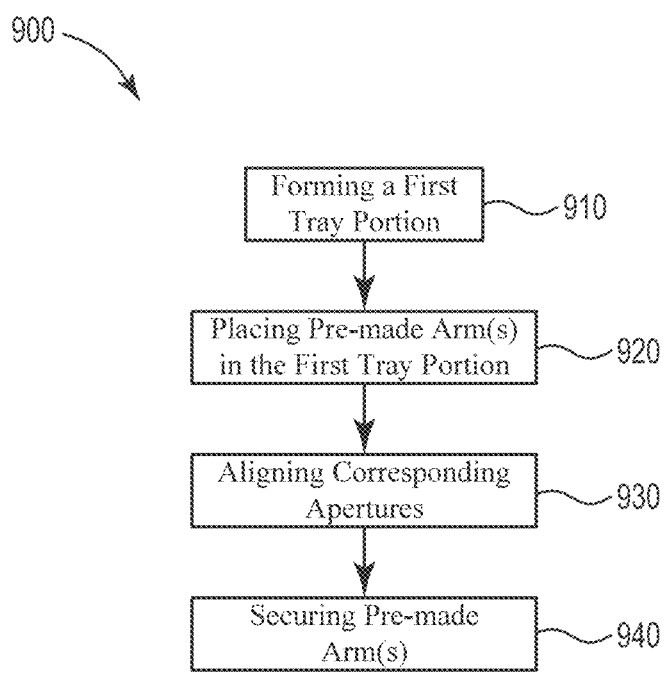
FIG. 9B is a method for forming a tray for a vaporization vessel, according to another embodiment.

FIG. 9B is a block diagram of an embodiment of a method 900 for assembling a tray (e.g., tray 500 in FIG. 8A). The method 900 starts at 910. At 910, a first portion is formed that includes a bottom plate (e.g., bottom plate 510), a side wall (e.g., side wall 530), an interior space defined by the bottom plate and the side wall, and one or more apertures (e.g., apertures 522) that extend through the bottom plate. The first portion in an embodiment may be formed by machining a single piece of material. In another embodiment, the first portion may be formed by attaching (e.g., welding) at least the side wall to the bottom plate. The method then proceeds to 920.

At 920, one or more pre-made arms (e.g., arm 550A, arm 550B) are placed in the tray. More specifically, the one or more pre-arms are placed in the interior space of the tray. The one or more pre-made arms include apertures (e.g., apertures 584A, apertures 584B) that extend through the arms. In an embodiment, the first portion includes an inner wall that forms a duct (e.g., inner wall 540). In an embodiment, the one or more pre-made arm(s) are placed in the interior space that is between the inner wall and the side wall. The method 900 then proceeds to 930.

At 930, the pre-made arms are arranged within the tray such that the aperture(s) in the arm(s) align with corresponding apertures in the bottom plate. Through-holes (e.g., through-holes 512) are formed corresponding pairs of apertures in the arm(s) and the bottom plate. The through-holes extending from the bottom surface of the bottom plate to the interior of tray. In an embodiment, the first portion may also include lower portions (e.g., lower portions 260 in FIG. 4). The lower portions extend from the lower surface of the bottom plate, and one of the lower portions is provided for each aperture in the bottom plate. In such an embodiment, each through-hole is formed by one of the apertures in the bottom plate, one of the apertures in the pre-made arm(s), and one of the lower portions. It should be appreciated that 920 and 930 might be combined in some embodiments. The method then proceeds to 940.

At 940, the pre-made arm(s) are secured to the first portion. In an embodiment, securing the pre-made arm(s) to the first portion may include screwing the pre-made arm(s) to the first portion. The pre-made arm(s) are screwed to the first portion with screws (e.g., screws 590). Each of the pre-made arm(s) includes one or more holes (e.g., screwholes 592) configured to receive a screw (e.g., screw 590). The pre-made arm(s) may each have holes for securing the pre-made arm to the bottom plate and holes for securing the pre-made arm to the side wall. In an embodiment, the pre-made arm may have holes for securing the pre-made arm to just the side wall. In another embodiment, securing the pre-made arm(s) to the first portion may include welding each of the one or more pre-made arm(s) to the first portion. The pre-made arms may be welded to the first portion through the bottom surface of bottom plate. For example, holes (e.g., holes 592) may be utilized to weld each of the pre-made arm(s) to the first portion. In an embodiment, the pre-made arm(s) may be secured to the first portion with a fillet weld. In another embodiment, pre-made arm(s) may be secured to the first portion with a high-purity adhesive or with brazing of the pre-made arm(s).

The examples of the embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A tray for a vaporization vessel, the tray comprising:
    a bottom plate having a surface configured to support a solid reagent;
    a side wall;
    a plurality of support posts integrated into the side wall, each support post comprising an elastic member extending upwardly beyond a top edge of the side wall;
    an interior space defined by the bottom plate and the side wall;
    an arm extending along the bottom plate from the side wall; and
    a central duct extending through and away from the bottom plate;
    wherein the central duct is configured to fluidly connect with at least one other tray stacked on top of or below the first tray to allow a carrier gas to flow through the tray and the first tray is rotated with respect to the at least one other tray stacked on top of or below the first tray such that none of the though-holes on the first tray align with through holes on the at least one other tray stacked on top of or below the first tray, wherein the tray is graphite coated with nickel.

2. The tray of claim 1, further comprising solid reagent, wherein the solid reagent is a metal halide from a group consisting of aluminum chloride, tungsten chloride, silicon iodide, cadmium chloride, and tantalum chloride.

3. The tray of claim 1, wherein an inner wall forms the central duct, the inner wall defining a recess for a seal and wherein the seal is made of an elastomeric material configured to be chemically compatible with the carrier gas and the reagent.

4. The tray of claim 1, wherein an inner wall forms the central duct, the inner wall having an upper surface that extends above a top edge of the side wall.

5. A vaporization vessel comprising:
    a housing;
    a first tray located within the housing, the first tray comprising: a bottom plate, a side wall, a plurality of support posts integrated into the side wall, each support post comprising an elastic member extending upwardly beyond a top edge of the side wall, one or more through-holes that extend through and above the bottom plate, a first central duct extending through and away from the bottom plate, and a surface for supporting a solid reagent to be vaporized, wherein the first tray is graphite coated with nickel; and
    one or more trays each stacked on top of or below the first tray within the vaporizer vessel, the central duct of the first tray fluidly connected with the one or more trays to allow a carrier gas to flow through the one or more trays;
    wherein the one or more tray is rotated with respect to an adjacent tray so that none of the one or more through-holes is aligned with a through-hole on the adjacent tray.

6. The vaporization vessel of claim 5, further comprising:
    a seal directly fluidly connecting the first central duct of the first tray and the second central duct of the second tray, the first tray including an inner wall that forms the central duct, and the seal directly contacting the inner wall and the second tray.

7. The vaporization vessel of claim 5, wherein the seal is made of an elastomeric material configured to be chemically compatible with the carrier gas and the reagent.

8. The vaporization vessel of claim 5, wherein the vaporizer vessel is configured to provide a stream of reagent gas that contains equal to or less than ten parts per million of metal impurities relative to the amount of vaporized reagent.

9. The tray of claim 1, comprising a plurality of arms.

10. The tray of claim 1, wherein the arm is located on a diameter of the tray.

\* \* \* \* \*